United States Patent [19]
Bickley

[11] 3,984,783
[45] Oct. 5, 1976

[54] AMPLIFIER
[75] Inventor: Robert H. Bickley, Scottsdale, Ariz.
[73] Assignee: Motorola, Inc., Chicago, Ill.
[22] Filed: Mar. 27, 1975
[21] Appl. No.: 562,710

[52] U.S. Cl. .................................. 330/40; 330/25; 330/29
[51] Int. Cl.² ........................................ H03F 3/04
[58] Field of Search .................. 330/22, 25, 29, 40

[56] References Cited
UNITED STATES PATENTS

| | | |
|---|---|---|
| 3,166,719 | 1/1965 | Wiencek .......................... 330/22 X |
| 3,513,406 | 5/1970 | Lewthauser .......................... 330/40 |
| 3,553,599 | 1/1971 | Hayamizu ........................ 330/40 X |
| 3,708,756 | 1/1973 | Fajen ................................ 330/40 X |

*Primary Examiner*—James B. Mullins
*Attorney, Agent, or Firm*—Eugene A. Parsons; Harry M. Weiss

[57] ABSTRACT

An amplifying circuit capable of providing the gain and linearity of Class A amplifier and power conversion efficiency of a Class B or C amplifier is provided. The circuit includes an amplifying device, such as a power transistor, and a biasing network that permits the device to operate in Classes A, B or C depending upon the amplitude of the input signal.

8 Claims, 10 Drawing Figures

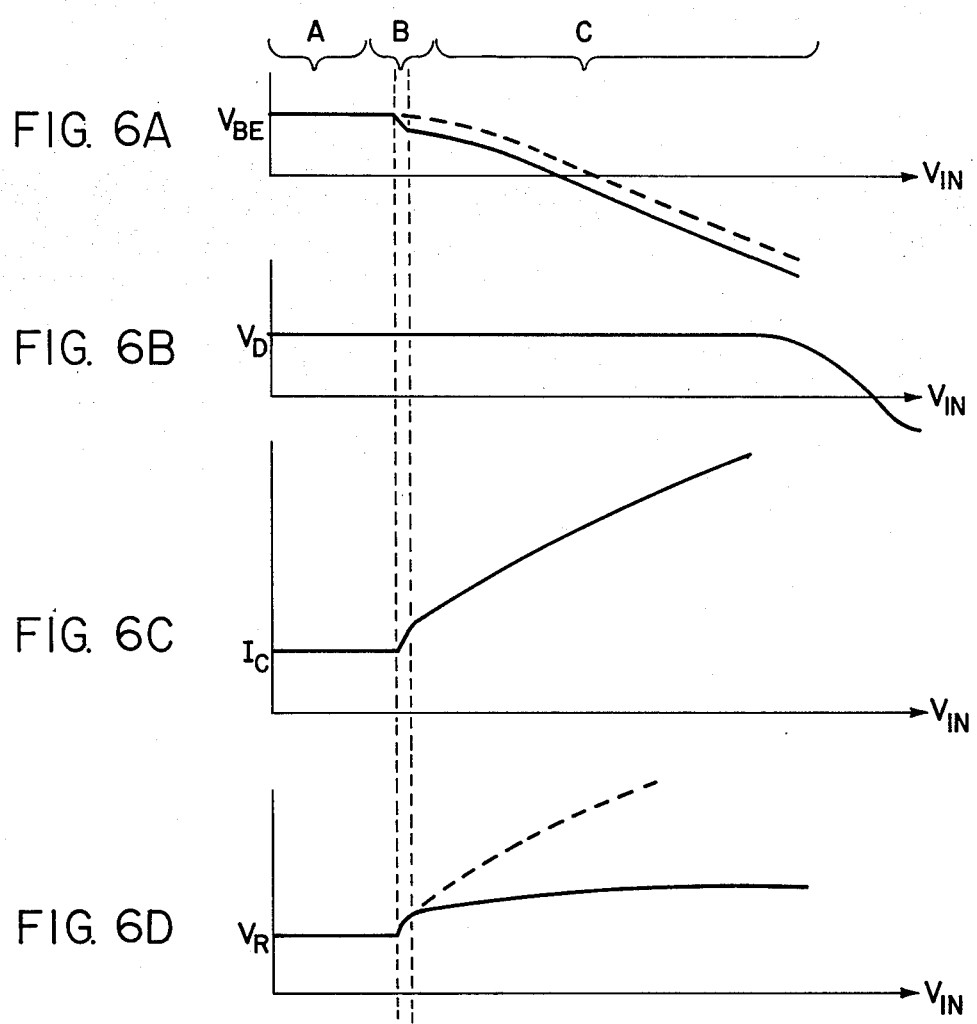
FIG. 6A
FIG. 6B
FIG. 6C
FIG. 6D
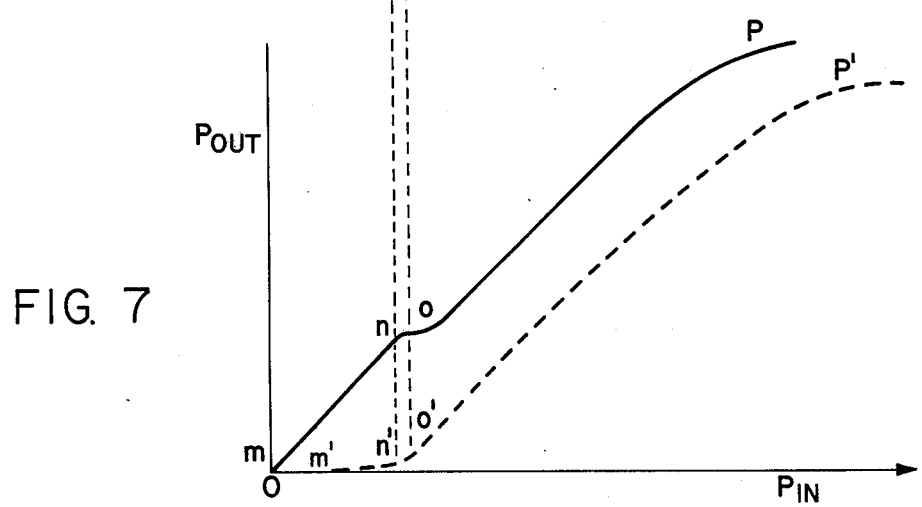
FIG. 7

AMPLIFIER

FIELD OF THE INVENTION

This invention relates to an improved amplifier and, more particularly, to biasing means for improving the linearity in small signal amplification and large signal power efficiency of an amplifying circuit.

BACKGROUND OF THE INVENTION

In amplifier art, ongoing efforts have been made to increase their linearity, dynamic range, stability, and power conversion efficiency and the efforts have yielded significant results. However, the results have been confined largely to improving one or, at best, two of these characteristics desired in an amplifier, but not to all of these desired characteristics in the same amplifier. For example, some improvements have been made to stabilize the amplifying device utilizing rather elaborate temperature compensating circuitry. Also, improvements have been made to biasing means to render the operation of a Class A RF amplifier for small amplitude input signals more linear. But such biasing means was not designed nor capable of enabling the same amplifier to operate in Class B or C mode at the same time for large amplitude input signals. Likewise, prior art biasing means designed to operate the amplifier in Class B or C mode for large amplitude input signals is not designed nor capable of operation in Class A mode for small amplitude input signals also.

SUMMARY OF THE INVENTION

It is therefore, an object of the present invention to provide an improved amplifier in general and more particularly to provide biasing means that enables the amplifier to operate in Class A, B or C mode depending upon the amplitude of the input signal.

It is another object of the present invention to provide an improved amplifier that provides higher power conversion efficiency.

It is yet another object of the present invention to provide an amplifier which provides more signal power gain so that lesser number of amplifying stages are required in a multi-stage amplifier network.

It is yet another object of the present invention to eliminate low temperature "turn-on" limitation.

The aforementioned and other objects of the present invention are achieved by providing an amplifying circuit having biasing means that biases an amplifying device to a first biasing level to amplify linearly a range of small input signals having an amplitude below a predetermined level and that adjusts the biasing level to another level to amplify larger amplitude input signals when the amplitude of the input signals exceeds said predetermined amplitude.

According to another feature of the present invention, the biasing means includes first biasing circuit for biasing the amplifying device to operate in Class A mode, second biasing circuit for biasing the amplifying device to operate in Class B or C mode and circuit means for enabling the first or the second biasing circuit selectively to operate the amplifying device in Class A or B and C mode respectively, depending upon the amplitude of the input signal.

According to yet another feature of the present invention, the first biasing circuit includes a closed loop DC biasing circuit interposed between the DC input of the amplifying device and the DC power supply.

According to a further feature of the present invention, the second biasing circuit includes means to minimize the transition from Class A to Class B or C mode of operation or vice-versa for minimizing the nonlinearity of the operation of the amplifying circuit.

The aforementioned and other features of the present invention will be clearer from the following detailed description of an illustrative embodiment of the present invention in conjunction with the accompanying drawings.

BRIEF DESCRIPTION OF THE DRAWINGS

FIGS. 6A–6D show certain voltage and current versus power input that are helpful in explaining the operation of the present amplifying circuit.

FIG. 7 shows the AC power input versus output waveform of the amplifying circuit.

DETAILED DESCRIPTION OF AN ILLUSTRATIVE EMBODIMENT OF THE PRESENT INVENTION

Figure 1:
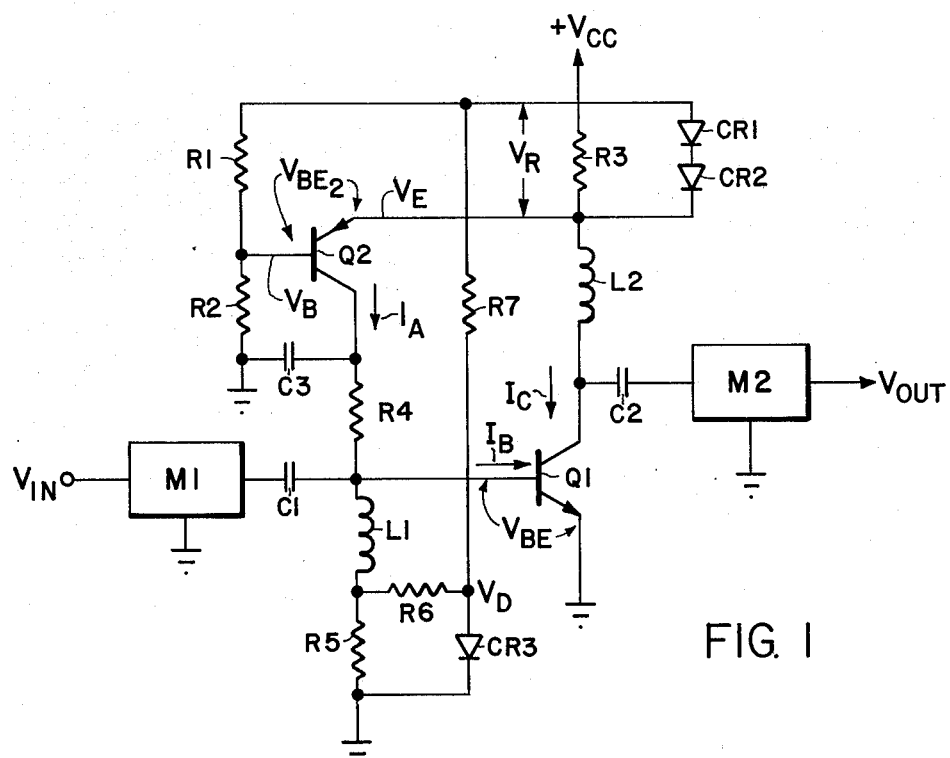
FIG. 1 shows an amplifying circuit according to the present invention.

Referring to FIG. 1, there is shown an amplifying circuit having biasing means for operating an amplifying device Q1 in Classes A, B or C mode depending upon the amplitude of the input signal applied thereto. The biasing means includes various active and passive circuit elements operatively connected to provide a closed loop bias to the amplifying device Q1 to assure response to small amplitude input signals in Class A mode. The biasing means also includes various elements connected to bias the amplifying device Q1 so that Q1 operates in Class B or C mode in response to large input signal amplitude.

For the amplifying device, a suitable element such as a conventional semiconductor power transistor Q1 may be utilized as illustrated in FIG. 1. Preferably the power transistor may be arranged in a common emitter configuration with its emitter connected to the chassis of the amplifying circuit. The amplifying circuit may include matching input and output impedances M1 and M2 for the amplifying device for the maximum power transfer in a conventional manner. Such input and output impedances may be also capacitor coupled to the amplifying device Q1 utilizing capacitors C1 and C2 of suitable sizes. While the biasing means of the present invention will be described in connection with the power transistor Q1, the input-output impedances M1 and M2 and the coupling capacitors C1 and C2, it is to be understood that the use of the present biasing means is not intended to be limited to such particular amplifying device.

Figure 2:
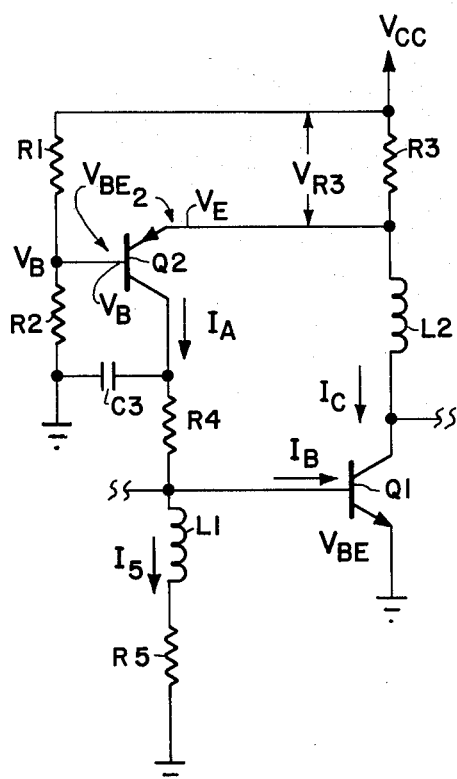
FIG. 2 shows those parts of the amplifying circuit shown in FIG. 1 that are involved in operating the amplifying device in Class A mode.
Figure 3:
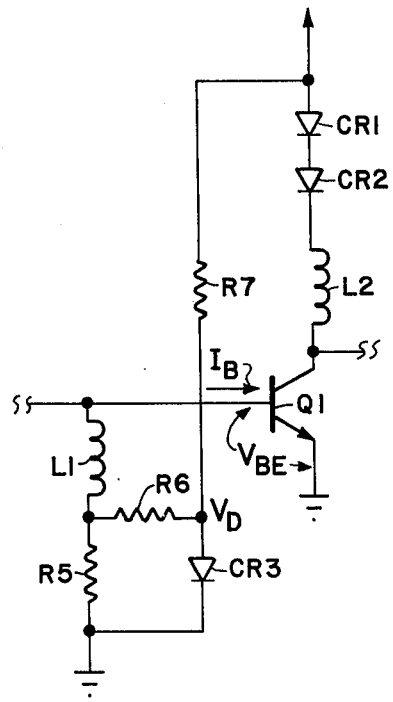
FIG. 3 shows those portions of the amplifying circuit which are involved in operating the amplifying device in Class B or C mode.

As illustrated in FIG. 1, the overall present biasing means comprises various active and passive circuit elements, such as transistor Q2, resistors R1–R8, capacitor C3, diodes CR1, CR2, CR3, RF chokes L1 and L2, connected to operate the amplifying device Q1 in Class A mode through B to C modes depending upon the amplitude of the input signal. Those parts of the circuit elements of the biasing means shown in FIG. 1 that are involved in operating the amplifying device Q1 in Class A mode are depicted in FIG. 2 for ease of understanding. Those parts of the circuit parameters of the biasing means shown in FIG. 1 that are involved in biasing the amplifying device Q1 so that Q1 operates in Class B or C mode are depicted in FIG. 3 for ease of understanding. As illustrated in FIGS. 2 and 3, the present biasing means comprises first biasing circuit to operate the amplifying device Q1 in Class A mode and second circuit to operate the same in Class B or C modes.

According to an aspect of the present invention, the first biasing circuit for biasing the amplifying device Q1 to operate in Class A mode is configured in a DC negative feedback loop arrangement, as illustrated in FIG. 2. The DC negative feedback loop comprises transistor Q2 for providing a current required to operate the amplifying device Q1 in a quiescent state in the absence or in the presence of small amplitude input signal. The loop includes other circuit elements namely, resistors R1–R5, capacitor C3 and choke L1, which are selected and configured to cause Q2 to conduct while Q1 operates in Class A mode. This is made possible by maintaining the voltage $V_E$, applied to the emitter electrode of Q2 by the power supply $V_{CC}$ of the amplifying circuit, high enough to cause transistor Q2 to conduct even in the absence of input signal. As transistor Q2 conducts, much of its collector current flows via $R_4$ through the base to emitter junction of the amplifying device Q1. The base current, $I_B$, largely contributed by the collector current, $I_4$, of Q2 forward biases the amplifying device and this causes Q1 to conduct even in the absence of the input signal $V_{in}$. With Q1 conducting, its collector current $I_c$ forms a voltage drop $V_R$ across the resistor R3. This causes the potential $V_E$ at the emitter electrode of Q2 of $V_{CC}-V_R$ amplitude. The circuit maintains the collector current of Q1 such that $V_{CC}-V_R=V_B+V_{BE2}$ and $V_{BE2}$ is forward biased to cause Q2 to conduct. In the aforementioned manner, elements of the closed loop are selected to forward bias the amplifying device Q1 so that it can operate in Class A mode for input signals of small amplitude.

As the amplitude of the input signal increases, the collector current $I_c$ of the amplifying device Q1 increases. This causes the voltage drop $V_R$ to increase. As the voltage drop $V_R$ increases further $V_{BE2}$ is decreased to a point where Q2 is turned off and the diodes CR1 and CR2 become conductive. Q2 is so biased that it turns off before CR1 and CR2 begin to conduct. This is made possible by selecting the resistors R1, R2, R3, and R4 and the diodes CR1 and CR2 such that Q2 becomes nonconductive before the voltage across the resistor R3 reaches the point where CR1 and CR2 starts to conduct. As this happens, the voltage, $V_E$, at the emitter of Q2 reaches a value less than that required to maintain its emitter-base junction forward biased. At this point, Q2 is biased to turn off. Thus, the resistor R3 serves the function of sensing the output level and the transistor Q2 serves the function of a switch in that so long as the potential at the emitter electrode thereof as sensed by R3 remains up to a certain level Q2 stays on but it is turned off when the potential falls below the certain level. The cutoff point at which the conductive transistor Q2 becomes nonconductive is controlled by the bias voltage of Q2 established by R1 and R2 and by the voltage drop across the parallel network formed by the resistor R3 and the diodes CR1 and CR2. As Q2 becomes nonconductive, the closed biasing loop becomes inactive.

At this point the second biasing circuit illustrated in FIG. 3 takes over. The second biasing circuit includes resistors R5, R6, R7 and the diodes CR1, CR2 and CR3 and the choke L1 connected in an open loop configuration as illustrated in FIG. 3 to operate the amplifying device Q2 in Class B or C mode. Various elements of the second biasing circuits are so selected that they permit the amplifying device Q1 to move into Class B and C modes from Class A as linearly as possible without sudden changes and vice versa. Diodes CR1 and CR2 connected in shunt with the resistor R3 of the closed loop biasing circuit minimize power losses in that once the second biasing circuit takes over the power consumed by the voltage sensing resistor R3 is limited by the voltage limiting effect of CR1 and CR2.

In summary then, the biasing means provided for the amplifying device includes a first or closed bias loop for operating the amplifying circuit in Class A mode for the input signal of up to a certain amplitude and a second or open loop biasing circuit for operating the amplifying circuit in Class B or C mode for the input signal above the certain amplitude. The transition point where the amplifying device turns off Class A mode operation and goes into Class B or C mode operation is judiciously determined by choosing the bias of transistor Q2, by means of bias resistors R1 and R2 and the resistor R3 of such characteristics that they complement the operating characteristics of the power amplifying device Q1. The biasing means for Q2 is designed so that the aforementioned transition from Class A to Class B or C mode of operation is also reversible, that is, amplifying device Q1 operating in Class B or C mode will revert to Class A mode automatically as the amplitude of the input signals decreases from an amplitude higher than said certain amplitude to a lower signal amplitude below the certain amplitude. The reverse transition takes place as Q2 begins to conduct as the voltage drop across CR1 and CR2 falls below the level where they begin to be nonconductive.

Figure 4:
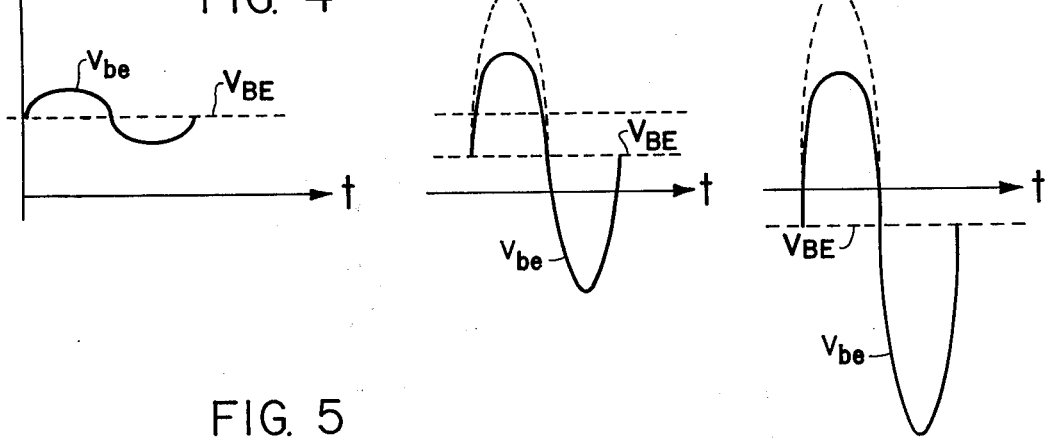
FIGS. 4A, 4B and 4C, and FIGS. 5A, 5B and 5C show the waveforms of the input voltages and output currents, respectively.
Figure 5:
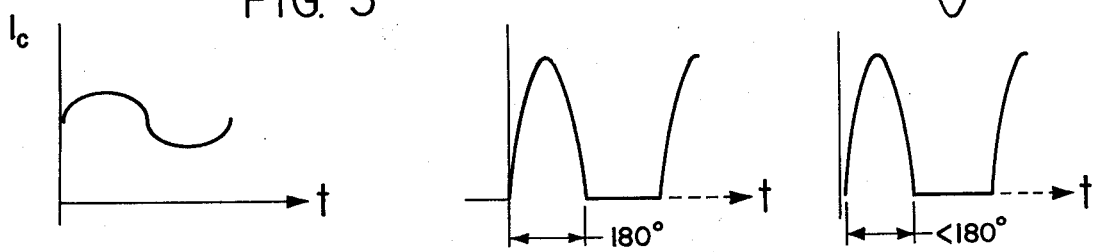

The various operative aspects of the present amplifying circuit and the biasing means described in general hereinabove will now be explained in detail in conjunction with FIGS. 4 through 7 hereinbelow. FIGS. 4A, 4B and 4C illustrate the average DC voltage, $V_{BE}$, and AC voltage, $v_{be}$ and across the base and emitter electrodes of Q1 and FIGS. 5A, 5B and 5C illustrate the output current, $I_C$ during the Class A, B and C operations. During the Class A operation, with no small signal input the current applied to Q1 the bias is essentially provided by the transistor Q2 via the resistor R4. This establishes the quiescent forward bias $V_{BE}$ as illustrated in FIG. 4A. When an input signal of small amplitude is applied, then it is combined with the voltage $V_{BE}$ across the base and the emitter. The resulting AC voltage is shown in the form of $v_{be}$ in FIG. 4A. This results in the output current $i_c$ as shown in FIG. 5A and results in a Class A mode of amplification. Q1 operates in Class A mode linearly up to a point where the amplitude of the input AC signal begins to cause the average DC value across the emitter to base to decrease to a point where the amplifying device Q1 does not conduct during a part or whole of the negative part of the AC input.

As the input signal amplitude increases to a point where $Q_2$ is turned off, the closed loop biasing circuit becomes ineffective. Now the DC potential $V_{BE}$ formed across the base to emitter is determined by two factors:

One is by the second biasing circuit and the other is the rectifying effect of the base to emitter junction of $Q_1$ upon the AC input signal $v_{be}$ applied to the base electrode of $Q_1$ from the input $V_{in}$. The transistor $Q_1$ goes through a continuous transition from Class A to Class B to Class C mode operation as the conduction angle of $Q_1$ goes from 360° down to 180° and down to less than 180°. The conduction angle decreases as the net potential drop across the base to emitter junction decreases due to the negative swing of the input AC. The net effect of the increase in the input signal is to drive the average DC value of the base to emitter bias further negative. Consequently, the collector current $I_c$ conduction angle decreases from 360° to less than 180°.

FIGS. 4A and 5A show $V_{BE}$, $v_{be}$ and $i_c$ of the amplifier when the input signal is small enough not to turn off the closed loop biasing circuit and $Q_1$ conducts 360°. FIGS. 4B and 5B show the same when the input signal amplitude is high enough to turn off the first biasing loop, and put into effect the second biasing circuit so that the amplifier operates in Class B mode with transistor $Q_1$ conducting 180°. FIGS. 4C and 5C show the same when the input signal amplitude gets even higher so that the amplifier operates in Class C mode with $Q_1$ conducting less than 180°.

The transition taking place in the operation of the amplifier in terms of average DC bias voltage across base to emitter is illustrated in FIG. 6A. As illustrated in FIG. 6A, the DC average potential across the base to emitter goes through the transition from the positive to the negative as the amplitude of the input increases. While the input remains zero amplitude or is of small amplitude, the average forward bias provided across the base to emitter at $Q_1$ is essentially constant as set by the current from the collector of $Q_2$ of the closed loop biasing circuit. As the transistor $Q_1$ moves into Class B mode of operation, the potential across the base to emitter decreases to a lower amplitude $V'_{BE}$ after the current from $Q_2$ is cut off. Thereafter, the average DC potential across base to emitter essentially undergoes a gradual transition from net positive to net negative somewhat in a linear fashion. After the transition, the bias is dictated by the second bias circuit.

Some what of sudden potential drop in the base to emitter from the constant level $+V_{BE}$ to another level $+V'_{BE}$ illustrated in FIG. 6A is contributed by the shift on the base to emitter potential at the time when the closed loop is turned off rendering the closed loop ineffective and the open loop operative. (Note here that the effect of choke L1 on the bias operation is negligible). The transition potential drop is rendered very small by providing a voltage $V_D$ close to the transitional forward bias voltage $V_{BE}$. This is done by selecting suitable CR3 and resistors R5 and R6 so that they establish the potential $V_D$ to be close to the forward bias potential $V_{BE}$ but less in amplitude. This prevents sudden change in the voltage amplitude $V_{BE}$. With $V_{BE} - V'_{BE}$ kept small, and the transition from Class A to Class B is maintained smooth and hence is made as linear as possible. This minimizes the distortion that would otherwise be introduced in the envelope of an amplitude modulated RF signal.

After the transition from Class A to Class B, the potential formed at the junction is dictated essentially by the second bias circuit and the amplitude of the input signal applied to the base of Q1. As the input signal amplitude increases further, the base to emitter voltage, $V_{BE}$ continues to decrease in a linear fashion as illustrated in FIG. 6A. As the bias voltage $V_{BE}$ continues to decrease until it becomes negative, Q1 starts to operate in Class C mode.

The effect of the transition from Class A to Class B to Class C on the average collector current $I_c$ and the voltage drop $V_R$ across the resistor R3 are illustrated in FIGS. 6C and 6D. As shown in FIG. 6C, the average DC current in the collector of Q1 goes through the transition from steady state to a gradual increase as the device Q1 operates in Class B and less sharply in Class C until it reaches a certain saturation point in response to the increasing input $V_{in}$. Note that the potential drop across the resistor R3 essentially remains constant during the Class A mode of operation. As the input increases and thus, the collector current increases as shown in FIG. 6D, the voltage drop $V_R$ across the resistor R3 increases proportionately. This would continue, as shown by the dotted line portion, but for the effect of the diodes CR1 and CR2 imposed upon the voltage drop across the resistor R3. As the voltage across the resistor R3 increases to a certain point it will reach where the diodes CR1 and CR2 become conductive. Consequently, now the voltage drop is largely determined by the forward voltage drop across the diodes CR1 and CR2. There is some increase in the voltage drop across CR1 and CR2 but not as much as is the case with the IR drop across the resistor R3. The transistor Q2 is so biased that before the voltage drop across the resistor R3 begins to be dictated by the diode voltage drop, it becomes nonconductive. This is established by judicious selection of the potential applied to the base by the dividing resistors R1 and R2 and by selecting the diodes CR1 and CR2 and the resistor R3 of such a resistance as required to turnoff Q2 at a desired transition point. Capacitor C3 is provided to restrict the bandwidth of the negative feedback loop provided by Q1 and Q2. That is, C3 renders the feedback loop immune to the AC variation of the input AC signal and noise and also assures stability of the closed loop.

In summary, hereinabove, there has been described biasing means that have a DC closed loop biasing circuitry for operating an amplifying device in Class A mode, an open loop biasing circuit for operating the amplifying device in Class B or C mode and means for enabling the biasing means to switch back and forth between the open and closed loop mode of operation depending upon the amplitude of the input signal. Advantageously, the amplifying device is designed to operate in Class A mode linearly in response to a range of input signals of small amplitudes and operate in Class B or C mode for providing high efficiency power gain.

Advantageously, the amplifier provides higher power gain. This is made possible by the fact that the improved biasing network in accordance with the present invention enables the amplifier to operate in Class A mode to provide the amplification in response to a small signal input and in Class B or C mode as the input signal amplitude increases. Thus, as illustrated in FIG. 7, the power output of the amplifier, $P_{out}$, increases substantially linearly along the curve MNOP as AC input power $P_{in}$ increases. This is to be constrasted with prior art power amplifiers which are principally designed to operate in Class B or C region as illustrated by the dotted line curve M'N'O'P'.

Utilizing the aforementioned amplifier, the power efficiency of a multi-stage amplifier network can be increased or, in the alternative, fewer stages of amplifiers may be utilized for providing the same power gain than that possible using known amplifiers. Also, as a result of the advantageous implementation of the Class A operation of the amplifier utilizing the closed bias loop, the problem of increased drive power to turn the amplifier on at low temperature is eliminated. This is due to the fact that the input voltage need not overcome the initial barrier of the junction potential across the amplifying device Q1 as would be encountered in Class B or C operation. This is so because the amplifier is already in the active region of operation since it is set at its quiescent operating state by the closed loop biasing circuit.

Various changes and modifications to the amplifying circuitry and particularly, to the biasing means of the present disclosure will be apparent to the one of ordinary skill without departing from the spirit and scope of the present invention as described hereinabove and set forth in the accompanying claims.

What is claimed is:

1. An amplifying circuit comprising an amplifying device and means for biasing said amplifying device to operate in Class A or Class B or Class C depending upon the amplitude of the input signal applied thereto.

2. The circuit according to claim 1, wherein said biasing means includes;
   first biasing circuit for biasing said amplifying device to operate in Class A mode in response to an input signal of up to a first amplitude;
   second biasing circuit for biasing said amplifying device to operate in Class B or C mode in response to an input signal of an amplitude which is greater than said first amplitude, and
   circuit means for enabling said first and said second biasing circuit selectively to operate said amplifying device so that said device shifts its operation from Classes A to B or C depending upon the input signal amplitude as it increases above said first amplitude.

3. The circuit according to claim 2, wherein said first biasing circuit means includes a closed loop DC biasing circuit interposed between the DC input and DC output of said amplifying device.

4. The circuit according to claim 3, wherein said closed loop DC biasing circuit includes means for sensing the output level of the amplifying device.

5. The circuit according to claim 4, wherein said second biasing circuit includes a passive impedance network adapted to provide a DC bias to the input of said amplifying device for enabling said amplifying device to operate in Class B or C mode.

6. The circuit according to claim 5, said second biasing circuit includes diode means connected in shunt with said sensing means for minimizing power loss therethrough.

7. The circuit according to claim 4, wherein said second biasing circuit includes potential dividing means adapted to smooth the transition from Class A to Class B mode of operation or vice versa for minimizing the nonlinearity of the operation of said amplifying circuit.

8. The circuit according to claim 7, wherein said first biasing circuit includes capacitive means for rendering said first biasing means immune to noise of the circuit and high frequency variation of the AC output.

* * * * *